United States Patent [19]

Gravrok et al.

[11] Patent Number: 4,868,904
[45] Date of Patent: Sep. 19, 1989

[54] COMPLEMENTARY NOISE-IMMUNE LOGIC

[75] Inventors: R. J. Gravrok, Minneapolis; R. M. Warner Jr., Edina, both of Minn.

[73] Assignee: Regents of the University of Minnesota, Minneapolis, Minn.

[21] Appl. No.: 98,277

[22] Filed: Sep. 18, 1987

[51] Int. Cl.$^4$ .................. H03K 3/26; H03K 17/74; H03K 17/16
[52] U.S. Cl. .................. 307/443; 307/454; 307/272.1; 307/279; 307/302; 307/318; 307/319; 307/475; 365/155
[58] Field of Search .............. 307/475, 443, 445, 454, 307/456, 272.1, 279, 302, 318-319; 365/154-156, 206

[56] References Cited

U.S. PATENT DOCUMENTS

| | | | |
|---|---|---|---|
| 2,989,713 | 6/1961 | Warner, Jr. | 338/20 |
| 4,110,841 | 8/1978 | Schroeder | 365/205 |
| 4,149,099 | 4/1979 | Nagami | 307/279 |
| 4,321,492 | 3/1982 | Hollingsworth | 307/279 |
| 4,349,894 | 9/1982 | Caudel | 365/154 |
| 4,375,677 | 3/1983 | Schuermeyer | 365/154 |
| 4,400,799 | 8/1983 | Gudger | 365/95 |
| 4,554,644 | 11/1985 | Chen et al. | 365/154 |
| 4,578,601 | 3/1986 | McAlister et al. | 307/475 |
| 4,607,350 | 8/1986 | Scianna | 365/154 |
| 4,686,396 | 8/1987 | Law et al. | 307/443 |

FOREIGN PATENT DOCUMENTS 0021141 6/1980 European Pat. Off. ............ 307/456

OTHER PUBLICATIONS

"Ideas for Design" Hoecherl Electronic Design Z 1/18/70.
M. M. Mano, *Digital Logic and Computer Design*, Prentice-Hall, p. 67 (1979).
Inst. Phys. Conf., No. 339, pp. 227–236 (1977).
IEEE, JSCS, SC-12, pp. 485–496 (1977).
IEEE, ED-29, pp. 1110–1115 (1982).
IEEE, EDL-7, p. 145 (Mar. 1986).
IEEE, JSCC, SC-19, pp. 10–22 (1984).
S. M. Sze, *Physics of Semiconductor Devices*, 2nd Ed. Wiley Interscience, p. 618 (1981).
R. M. Warner, Jr., "A New Passive Semiconductor Component", *IRE National Convention Record*, vol. 6, p. 43, 1958.
Motorola Inc. "I/C Logic for Control Functions in High-Noise Industrial Environments" MC660 Series, Mar. 1971 (4 pages).
J. Lohstroh, *The Punch-Through Device as a Passive Exponential Load in Fast Static Bipolar RAM Cells*, IEEE, JSSX, SC-14, pp. 840–844 (1979).
J. Lohstroh, *Worst-Case Static Noise Margin Criteria for Logic Circuits and Their Mathetical Equivalence*, IEEE, JSSC, SC-18, pp. 803–806 (1983).
R. J. Gravrok and R. M. Warner, Jr., *Logic Family and Memory-Cell Designs Providing Abrupt Voltage Transistions and High Noise Margins.*
*Electronics*, Sep. 3, 1987, p. 45, beginning in the middle of the second column entitled "Noise Margins".

Primary Examiner—John S. Heyman
Assistant Examiner—M. R. Wambach
Attorney, Agent, or Firm—Kinney & Lange

[57] ABSTRACT

Logic gates with large logic swings and large noise margins use complementary pull-up and pull-down enhancement-mode drivers. Connected between the input node of the logic gate and the control electrode of each of the drivers is a series combination of a level shifter (or constant-voltage element) and a current regulator (or constant-current element). The level shifter permits a voltage drop approximately independent of current, while the current regulator limits current flowing between the input node and the control electrode approximately independent of voltage.

37 Claims, 14 Drawing Sheets

COMPLEMENTARY NOISE-IMMUNE LOGIC

COMPLEMENTARY NOISE-IMMUNE LOGIC REFERENCE TO COPENDING PATENT APPLICATION

Reference is hereby made to a copending patent application entitled A NOVEL FAMILY OF NOISE-IMMUNE LOGIC GATES AND MEMORY CELLS by R. J. Gravrok which was filed June 10, 1987, Serial Number 60,318, which is assigned to the same assignee as the present application. That copending patent application is hereby incorporated by reference.

BACKGROUND OF THE INVENTION

1. Field of the Invention.

The present invention relates to digital logic circuits, including memory cells and logic gates.

2. Description of the Prior Art.

Integrated circuit logic designers have traditionally preferred enhancement-mode devices as drivers. However, because junction-controlled devices suffer from an unrestricted voltage swing of about three-fourths of a volt, using such transistors to achieve logic circuits with large noise margins and symmetric "rail-to-rail" logic swings has been difficult. Today's successful bipolar digital logic families (CML and ECL) switch substantial amounts of current to achieve well-defined logic states. The resulting logic swings, however, are typically less than one volt.

There is a continuing need for improved integrated circuit logic which will achieve performance characteristics which more closely approach the ideal properties and characteristics for a logic element.

SUMMARY OF THE INVENTION

In the above-mentioned copending patent application, a new family of digital logic called Noise-Immune Logic (NIL) was disclosed. NIL circuits provide improved noise margin characteristics and very desirable voltage-transfer characteristics by preferably including a voltage level shifter and a current regulator connected in series between an input terminal and the control electrode of an enhancement mode driver. The voltage level shifter establishes a voltage drop across itself which is essentially independent of current flowing through it, while the current regulator establishes a constant current flowing from the input terminal to the control electrode approximately independent of the voltage across the current regulator.

The present invention is a new logic family called Complementary Noise-Immune Logic (CNIL) which takes advantage of the concepts of the NIL logic family, while yielding a dramatic improvement in overall logic performance. The CNIL logic gate includes a pair of complementary pull-up and pull-down drivers connected to an output node. The control electrode of each driver is connected to the input node of the logic gate through a series circuit which includes means for limiting current and means for establishing a voltage drop.

By using complementary drivers in its output stage, the CNIL gate offers significantly improved performance over NIL gates. In particular, CNIL gates consume much less standby power, operate at higher speeds, and provide a more symmetric logic signal.

DETAILED DESCRIPTION OF THE PREFERRED EMBODIMENTS

Figure 1:
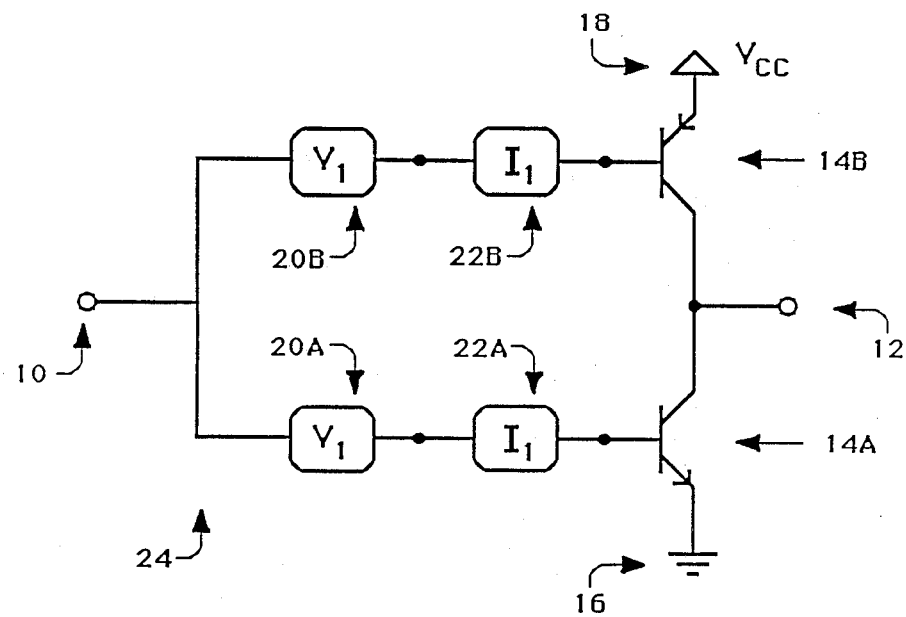
FIG. 1 is an electrical schematic diagram showing a CNIL inverter gate.

In FIG. 1, the CNIL logic family of the present invention is illustrated by one of its basic building blocks, inverter gate 24. An input logic signal is applied to input node 10, and an output logic signal, which is logically inverted with respect to the input signal, appears at output node 12. CNIL inverter gate 24 employs complementary drivers in a push-pull configuration. In the particular embodiment shown in FIG. 1, the complementary drivers are NPN pull-down transistor 14A and PNP pull-up transistor 14B. The collectors of transistors 14A and 14B are connected to output node 12. The emitter of pull-down transistor 14A is connected to ground 16, while the emitter of pull-up transistor 14B is connected to $V_{CC}$, the positive power supply rail 18.

Connected between input node 10 and the base of pull-down driver transistor 14A is a series circuit which includes constant-voltage element 20A and constant-current element 22A. Similarly, a series circuit formed by constant-voltage element 20B and constant-current element 22B is connected between input node 10 and the base of pull-up driver transistor 14B. Constant-voltage elements 20A and 20B, which may also be termed "level shifters" permit a known voltage drop (in this particular embodiment $V_1$) across their terminals which is approximately independent of current flowing throught it. Constant-current elements 22A and 22B, which may also be termed "current regulators" or "current-limiting voltage sponges" limit the current flowing through their respective series paths to an essentially constant current (in this case $I_1$) approximately independent of the voltage which appears across their terminals.

To explain the overall operation of CNIL inverter gate 24, the individual and combined characteristics of the constant-voltage elements 20A and 20B and the constant-current elements 22A and 22B will be discussed.

Figure 2:
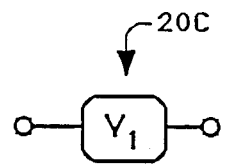
FIG. 2 shows a generic schematic symbol for a constant-voltage element of the type used in the CNIL logic gate of FIG. 1.
Figure 3:
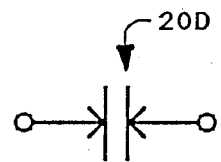
FIG. 3 is a specific schematic symbol for a punch-through level-shifter element.

FIG. 2 shows the generic schematic symbol for a constant-voltage element 20C (similar to elements 20A and 20B). FIG. 3 is a specific schematic symbol 20D for a punch-through level shifter element, which can be used as a constant-voltage element. A punch-through level-shifter can be implemented for example with a simple $P+N-P+(20D)$ or $N+P-N+$ semiconductor structure. That structure is shown and discussed in more detail in the previously-mentioned copending application.

Figure 4:
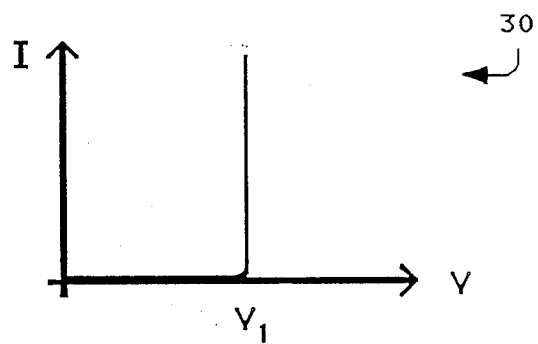
FIG. 4 is an idealized current-voltage characteristic of a constant-voltage element such as shown in FIG. 2.

FIG. 4 is a current-voltage characteristic 30 of a constant-voltage element such as elements 20A-20D. As illustrated in FIG. 4, the constant-voltage elements 20A-20D exhibit practically no conduction with a bias less than the punch-through voltage $V_1$ and exhibits a steep turn-on at $V_1$. This effectively limits the voltage across element 20A-20D to $V_1$. Typically $V_1$ is about one-half of the supply voltage, in order to yield a symmetric logic signal.

Figure 5:
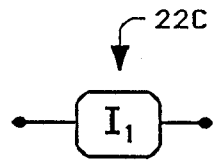
FIG. 5 is a generic schematic symbol for a constant-current element.
Figure 6:
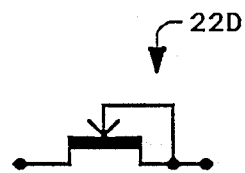
FIG. 6 is a schematic symbol for a depletion-mode JFET used as a constant-current element.

FIG. 5 is a generic schematic symbol for constant-current element 22C (similar to elements 20A and 22B). In a preferred embodiment, constant-current element 22C is formed by a depletion-mode (D-mode) JFET structure 22D shown in FIG. 6. In the preferred embodiment shown in FIG. 6, the constant-current properties of D-mode JFET 22D (with common gate and source) are used to act as a constant-current voltage sponge.

Figure 7:
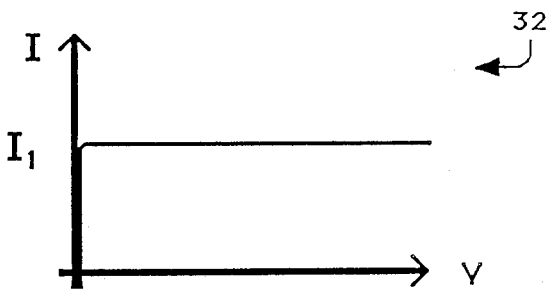
FIG. 7 is an idealized current-voltage characteristic of a constant-current element.

FIG. 7 shows a current-voltage characteristic 32 of a constant-current element 22A-22D. This element absorbs voltage across itself while limiting the current through it to a constant value of $I_1$. The value of $I_1$ is preferably selected to limit the base current being provided to drivers 14A and 14B to a reasonable value to avoid excessive stored base charge and to limit wasteful power consumption during standby. On the other hand, $I_1$ is preferably selected to provide a finite amount of standby current in order to ensure that the present logic state is held stable.

Figure 8:
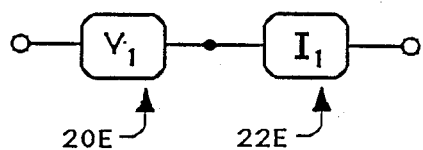
FIG. 8 shows a series connection of a constant-voltage element and a constant-current element.

FIG. 8 shows a series connection of a constant-voltage element 20E and a constant-current element 22E. This series circuit 34 is similar to the series circuits connected between the input node 10 and the bases of driver transistors 14A and 14B. It is the combined operation of the current-independent voltage control provided by constant-voltage element 20E and the voltage-independent current control provided by constant-current element 22E that provides large noise margins and logic swings possible with CNIL logic. In addition, constant-voltage element 20E and constant-current element 22E offer the ability to control, independently, the current and voltage levels within the CNIL logic family.

The ordering of the constant-voltage and constant current elements may be interchanged and yield similar results, therefore both permutations are claimed throughout this invention.

Figure 9A:
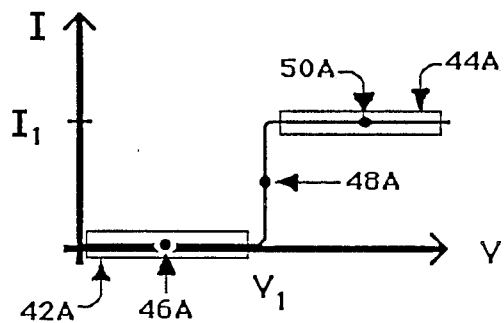
FIGS. 9A, 9B and 9C are current-voltage characteristics of the combined circuit of FIG. 8, the constant-voltage element, and the constant-current element, respectively.
Figure 9B:
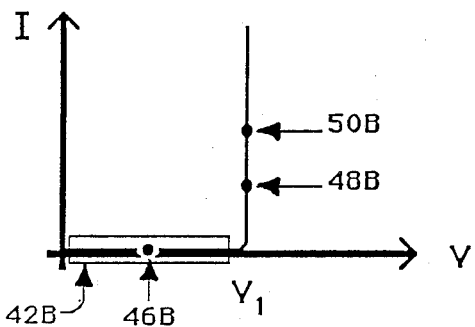
Figure 9C:
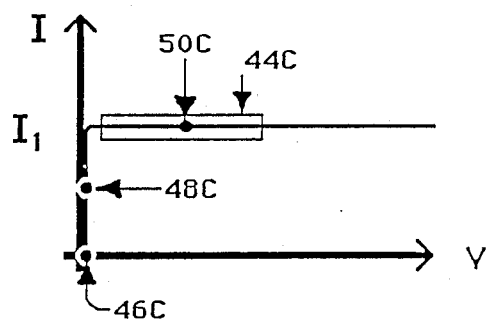

Three current-voltage characteristics 36, 38 and 40 are shown in FIGS. 9A-9C, respectively. The combined current-voltage characteristic 36, of series circuit 34 shown in FIG. 8, is illustrated in FIG. 9A. FIG. 9B shows the individual current-voltage characteristic 38 of constant-voltage element 20E. FIG. 9C is the current-voltage characteristic 40 of constant-current element 22E.

For discussion purposes, in FIGS. 9A-9C three operating points of the series circuit of FIG. 8 have been marked. The first point (marked as 46A, 46B and 46C in FIGS. 9A-9C, respectively) is the operating point where the voltage across series circuit 34 is somewhat less than $V_1$. Therefore, constant-voltage element 20E will not conduct a substantial amount of current, and the amount of applied bias will be absorbed entirely across constant-voltage element 20E with no substantial current flowing through series circuit 34. The operating point 46C of constant-current element 22E is at the origin of current-voltage characteristic 40 shown in FIG. 9C.

The second operating point labeled 48A, 48B and 48C is at the transition point where series circuit 34 starts to conduct because $V_1$ volts has been applied to it. At this point, the applied bias of $V_1$ is absorbed across constant-voltage element 20E which will begin to conduct and limit the voltage across itself to $V_1$.

The third operating point labeled 50A, 50B and 50C is where the bias applied to the series circuit is somewhat greater than $V_1$. In this case, constant-voltage element 20E acts to limit the voltage across itself to $V_1$. The additional amount of applied bias is absorbed across constant-current element 22E. Note that constant-current element 22E acts to limit the series current to a value of $I_1$.

The rectangles 42A and 42B shown in FIGS. 9A and 9B show the valid voltage-absorbing regime of constant-voltage element 20E when series circuit 34 is not conducting and the applied bias is less than $V_1$. Rectangles 44A and 44C in FIGS. 9A and 9C show the valid voltage-sponging regime of constant-current element 22E when the applied bias is greater than $V_1$ and series circuit 34 is conducting.

Figure 10:
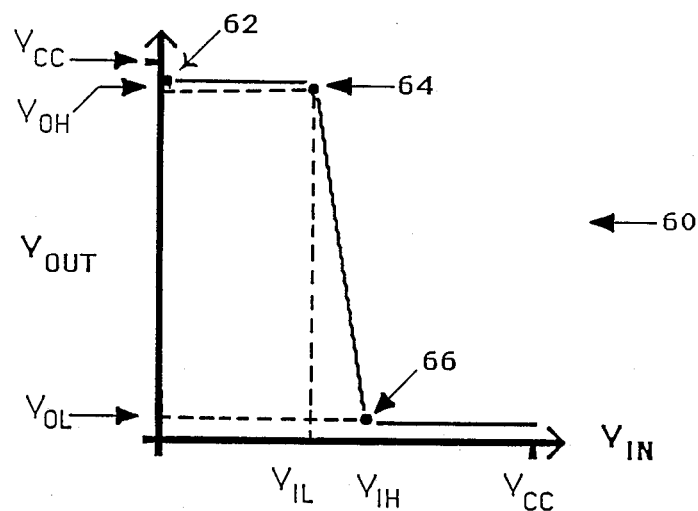
FIG. 10 is the voltage-transfer characteristic of the CNIL inverter gate of FIG. 1.

FIG. 10 is the voltage-transfer characteristic 60 of CNIL inverter gate 24 in FIG. 1. In the following discussion, it will be assumed that power-supply voltage $V_{CC}$ is +5 volts, since this is a voltage-supply level commonly used in digital logic circuits. In other embodiments, however, it may be smaller (for example to provide faster operation), or it may be larger (in order to interface with other systems or to operate in very electrically noisy environments).

To develop the voltage-transfer characteristic 60 shown in FIG. 10, start by considering a low-to-high logic transition at input node 10 of CNIL inverter gate 24. Starting with $V_{IN}$ at 0 volts, constant-voltage element 20A, constant-current element 22A, and pull-down driver 14A will all be OFF. The 5-volt drop between positive $V_{CC}$ rail 18 and input node 10 will turn ON constant-voltage element 20B, constant-current element 22B, and pull-up transistor driver 14B. Constant-voltage element 20B will absorbe $V_1$ volts; constant-current element 22B will limit the base current of driver transistor 14B to $I_1$, and will share the remaining potential (5 volts–$V_1$ volts) with the forward-biased emitter-base junction of transistor 14B. With driver transistor 14B saturated and pull-down driver transistor 14A OFF, output node 12 will be pulled up to within about 2/10ths of a volt of $V_{CC}$. This yields a logic $V_{OH}$ (output high) of about 4.8 volts, as illustrated by point 62 on voltage transfer characteristic 60.

In other embodiments, where some loss of signal swing and noise margins is tolerable, $I_1$ is designed low enough to keep drivers 14A and 14B from saturating. This lowers the power consumption and reduces excess stored base charge—a very useful design feature of the CNIL logic gates of the present invention. In still another preferred embodiment of the present invention, Schottky-clamped BJTs are used as driver transistors 14A and 14B to prevent saturation and hence improve transition speed.

The first break point 64 of voltage-transfer characteristic 60 occurs when the input voltage is raised to a point where constant-voltage element 20B will just stop conducting and hence pull-up transistor driver 14B will come out of saturation. This defines the $V_{IL}$ (input low) point on voltage-transfer characteristic 60. This point is $V_{IL} = V_{CC} - (V_1 + V_{BEsat})$.

At the second break point 66, the input voltage has been raised to a point where constant-voltage element 20A has absorbed $V_1$ and is now conducting. The current flows through constant-current element 22A and turns on pull-down transistor driver 14A. This defines the $V_{IH}$ (input high) point 66 on voltage-transfer characteristic 60 which is approximately $V_{IH} = V_1 + V_{BEsat}$. As the voltage on input node 10 is raised to $V_{CC}$, the additional voltage is absorbed across constant-current element 22A while a constant current $I_1$ is fed into the base of pull-down driver transistor 14A to keep it conducting. With driver 14A saturated, the output is held at logic low ($V_{CEsat}$ of transistor 14A) of about 0.2 volt. This defines the $V_{OL}$ (output low) of the voltage-transfer characteristic 60. Meanwhile, pull-up driver transistor 14B has been OFF, thus avoiding the "totem-pole current" that is a serious problem in other logic families. This is readily achieved if $V_1$ for both constant-voltage elements 20A and 20B is equal to or greater than one-half of $V_{CC}$. For example, totem-pole current is that current which is drawn from the supply when both driver transistors 14A and 14B are ON. This causes troublesome noise spikes on the power supply and causes large amounts of wasted power, thus reducing overall circuit performance.

Although totem-pole current can be totally eliminated as described above by making $V_1$ equal to or greater than one-half of $V_{CC}$, a small amount of transient totem pole current may be tolerable as a trade-off for faster switching time. For example, in one embodiment $V_1$ is about 2 volts and $V_{CC}$ is 5 volts. This results in a small amount of transient totem pole current, but yields large noise margins greater than 2V.

One of the primary advantages of the CNIL logic of the present invention is that it is possible to design logic elements where both of the complementary drivers are not ON simultaneously; but operating separately they are able to pull a heavily loaded output node 12 to either $V_{CC}$ or electrical ground quickly and efficiently.

It can also be seen that the standby current consumed is only the small amount of base current, which is limited by the constant-current elements 22A and 22B. This base current is supplied by the previous gate which is driving input node 10. In a preferred embodiment, both of the constant-current elements 22A and 22B are designed with the same values of current $I_1$. This yields a dataindependent standby power consumption of ($I_1 \times V_{CC}$) watts. Also in preferred embodiments driver transistors 14A and 14B have high betas, so that during transitions at output node 12, drivers 14A and 14B are able to push and pull large collector currents to effect rapid logic transitions, while standby power consumption is kept at a minimum. The conveniently controllable design trade-off between power consumption and speed of operation is still another advantageous feature of the CNIL logic of the present invention.

Noise margins for CNIL logic gate 24 of FIG. 1 can be obtained from the voltage-transfer characteristic 60 shown in FIG. 10. The noise margin for a logic high at input node 10—the range of input voltage which yields a stable low output for the logic inverter 24—is defined as $V_{NMH} = V_{OH} - V_{IH} \approx 4.8V - (2 + 0.8)V = 2.0V$. The noise margin for a logic low is: $V_{NML} = V_{IL} - V_{OL} \approx 5.0V - (2 + 0.8)V - 0.2V = 2.0V$.

Figure 11:
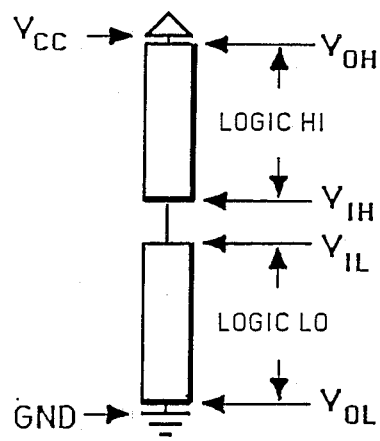
FIG. 11 is a one-dimensional graphical representation of allowed input logic levels of the CNIL logic gate of FIG. 1.

FIG. 11 is a one-dimensional graphical representation of the allowed input logic-levels for the present invention. The upper rectangle represents the voltage range that is valid for a logic high signal, while the lower rectangle represents the region of voltage that is valid for a logic low.

Figure 12:
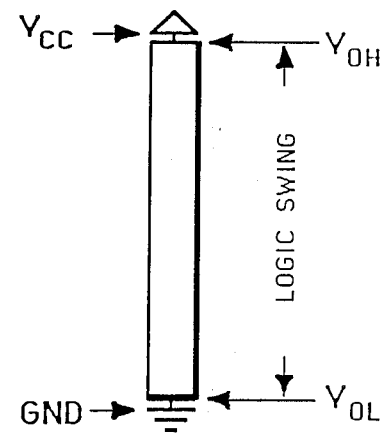
FIG. 12 is a one-dimensional graphical representation of a typical output logic swing for the CNIL logic gate of FIG. 1.

The logic swing at the output of the gate is: $V_{LS} - V_{OH} = V_{OL} \approx 4.8V = 0.2V - 4.6$. FIG. 12 is a one-dimensional graphical representation of a typical output logic swing obtained with the present invention.

Figure 13:
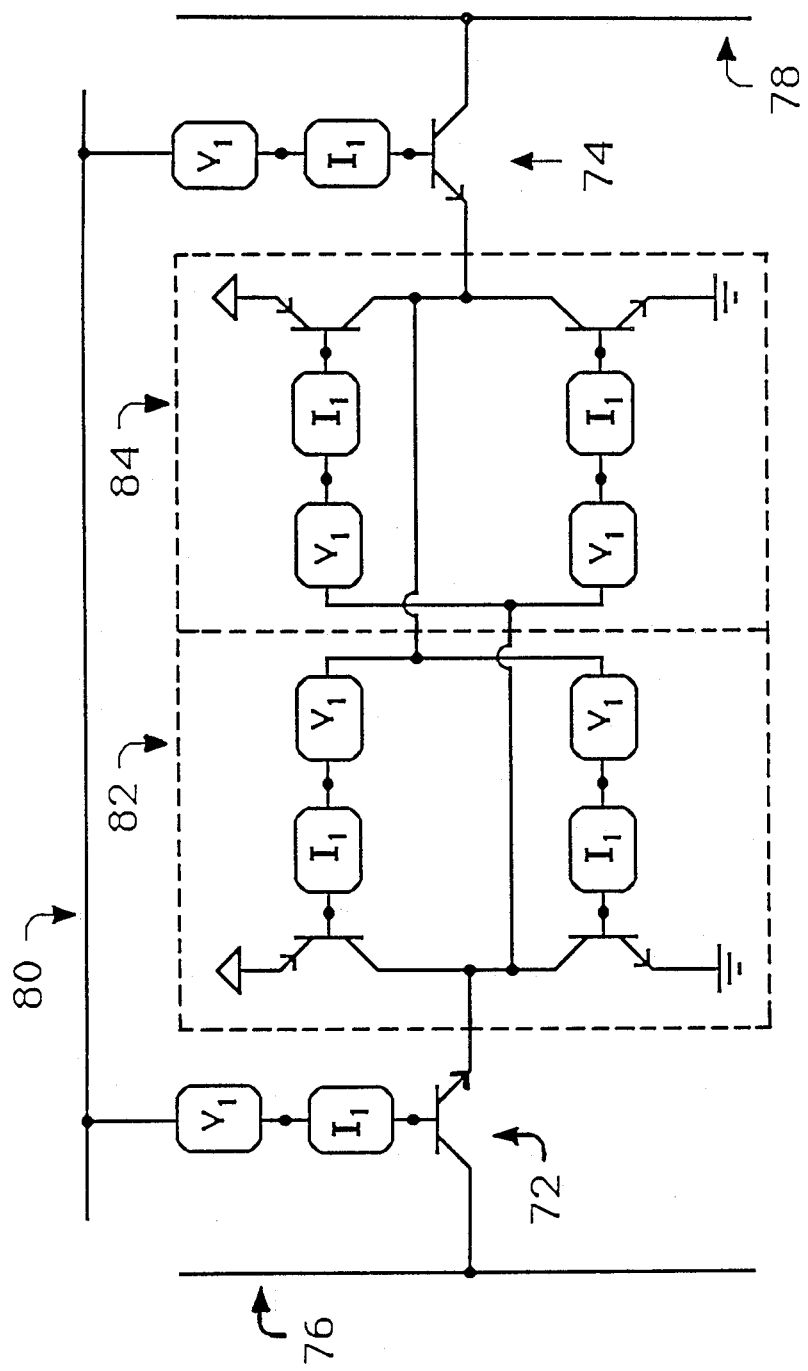
FIG. 13 is a schematic circuit diagram of a single static memory cell using CNIL logic.

FIG. 13 is a schematic circuit diagram of a single static-memory-cell 70 with access transistors 72 and 74, complementary data lines 76 and 78, and row-access line 80. Cell 70 consists of a pair of cross-coupled inverters 82 and 84 (which are like CNIL inverter 24 of FIG. 1) and operates much like a conventional RAM cell. However, since cell 70 and its access transistors 72 and 74 employ the concept of the present invention (e.g., constant-voltage and constant-current elements in series with the control electrodes of the driver transistors), memory systems using this CNIL circuit (and related derivatives) feature high-speed operation and have a very high degree of data integrity because the large noise margins associated with the present invention. Circuits like FIG. 13 yield memory cells that are practically immune to noise and read disturbances.

Figure 14:
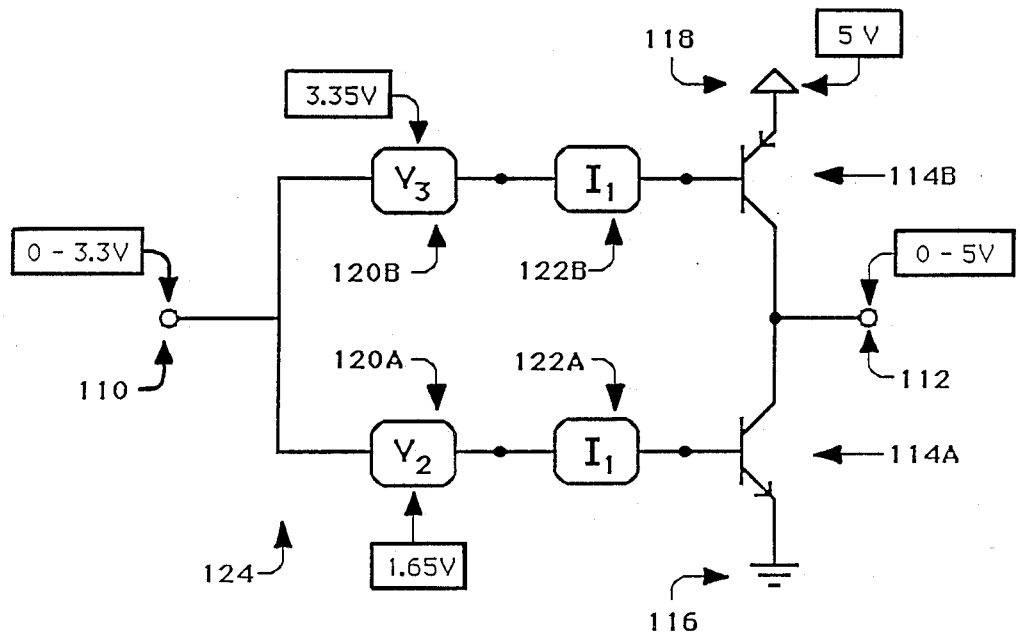
FIG. 14 is a schematic diagram of an asymmetric CNIL inverter gate for interfacing between 3.3V logic and 5V logic.
Figure 15:
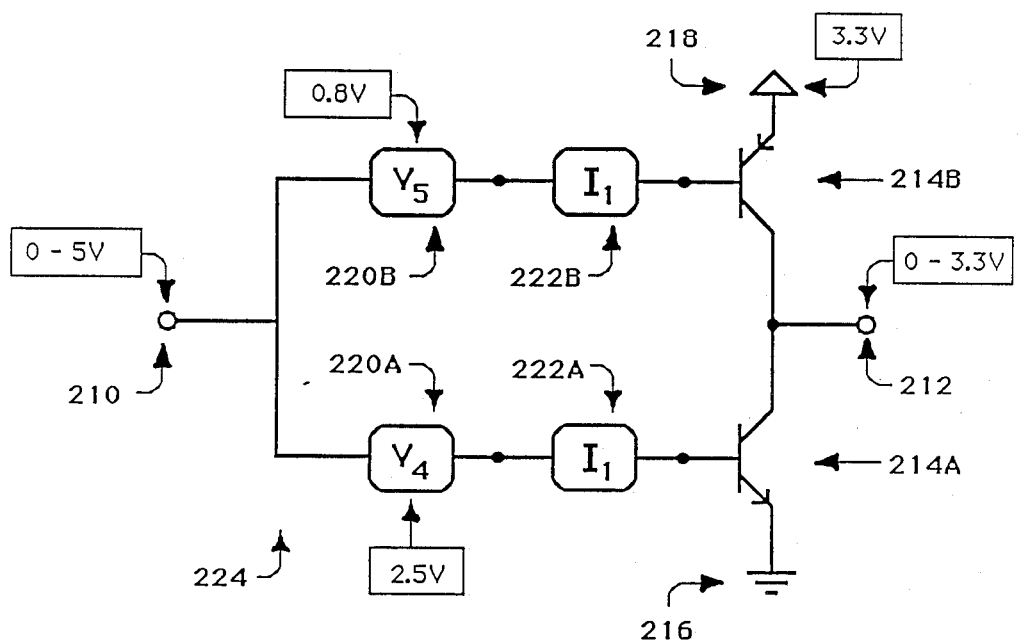
FIG. 15 is a schematic diagram of an asymmetric CNIL inverter gate for providing a 5V-to-3.3V logic interface.

Two other useful logic elements that are possible using CNIL logic are shown in FIGS. 14 and 15. Recently, in VLSI circuits, a new 3.3V power supply standard has come to market for some memory chips (e.g., IBM's 4-Megabit DRAMs). However, these new 3.3V chips must interface with the currently popular 5V parts (microprocessors, etc.). This is a real problem. Using CNIL gates that employ constant-voltage elements that turn ON at different voltages, this interface can be readily implemented.

FIG. 14 is a schematic circuit diagram (similar to FIG. 1) for an asymmetric CNIL inverter gate 124 that can interface between 3.3V logic and 5V logic. As shown in FIG. 14, interface inverter gate 124 includes input node 110, output node 112, a pair of complementary driver transistors 114A and 114B, ground node 116, positive rail 118, constant-voltage elements 120A and 120B, and constant-current elements 122A and 122B. The concept behind this interface is to design the values of the turn-on voltages ($V_2$ and $V_3$) of the constant voltage elements 120A and 120B to effect a logic transition at the output to occur when the input passes through the halfway point of its logic swing. By defining the maximum voltage at input node 110 to be $V_{MAXIN}$ (3.3V in this case) and the maximum voltage at output node 112 to be $V_{MAXOUT}$ (5V in this case), the approximate values of $V_2$ and $V_3$ can be specified. As identified in FIG. 14, $V_2 - (V_{MAXIN}/2) = 1.65V$, and $V_3 = V_{MAXOUT} - (V_{MAXIN}/2) = 3.35V$.

As shown in FIG. 15 it is also possible to use the present invention to realize a 5V-to-3.3V logic interface. Interface inverter gate 224 of FIG. 15 includes input node 210, output node 212, complementary drivers 214A and 214B, ground 216, $V_{CC}$ positive rail 218, constant-voltage elements 220A and 220B, and constant-current elements 222A and 222B. The values of turn-on voltage ($V_4$ and $V_5$) for the constant-voltage elements (220A and 220B can be calculated as above and are noted in FIG. 15— $V_4 = (V_{MAXIN}/2) = 2.5V$, and $V_5 = V_{MAXO\ OUT} - (V_{MAXIN}/2) = 0.8V$.

Another useful embodiment of the CNIL inverter exists which features one less component. This five-element circuit 240 is schematically displayed in FIG. 16. By interchanging the order of the constant-voltage elements (20A and 20B) and the constant-current elements (22A and 22B) of the example CNIL inverter of FIG. 1, it becomes apparent that the two constant-current elements serve a redundant function and, therefore, one of them may be eliminated to produce circuit 240 of FIG. 16. Interchanging the series ordering of a constant-current element and a constant- voltage element will not adversely effect their combined operation. For purposes of identification, node 250 is the input node of five-element inverter 240. Node 252 is the internal node common to constant-current element 256 and the two constant-voltage elements 258A and 258B. Complementary BJT driver transistors 260A and 260B have their collectors connected together at output node 254. The single constant-current element 256 of FIG. 16 exhibits bilateral current limiting as shown in FIG. 17. This electrical characteristic may be achieved using a thin-channel JFET structure with an electrically floating gate.

Figure 16:
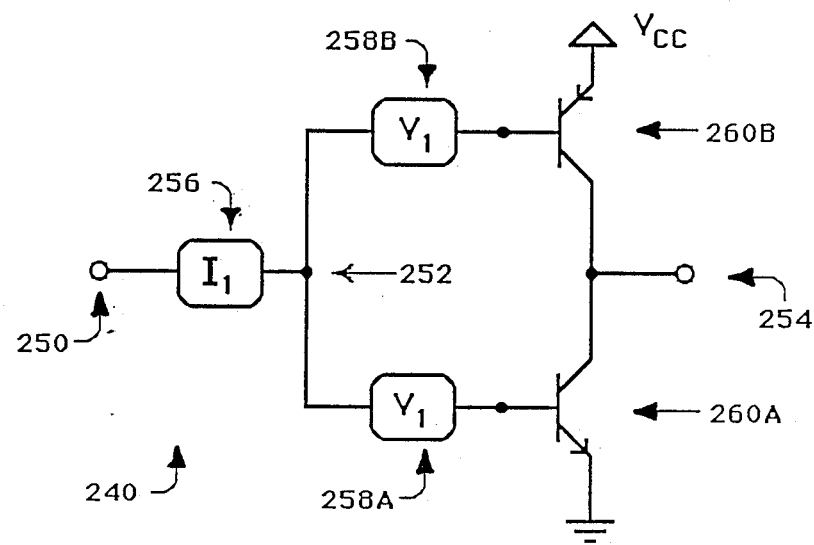
FIG. 16 is a schematic diagram of another embodiment of a CNIL inverter gate.
Figure 17:
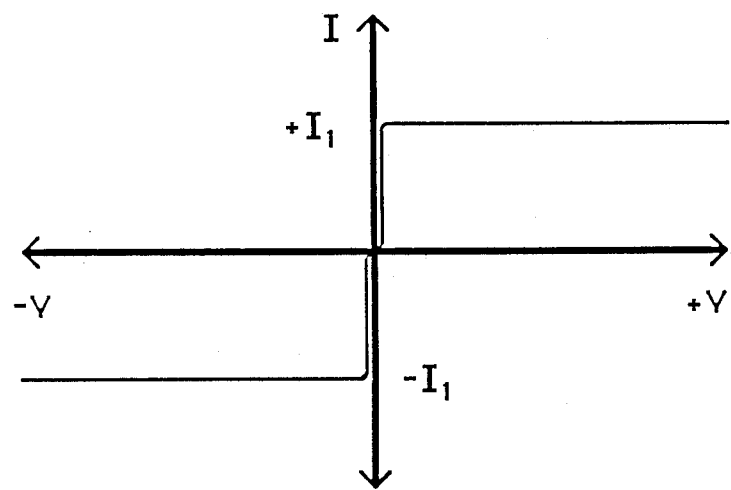
FIG. 17 is a current-voltage characteristic of a bilateral constant-current element of the type used in the circuit of FIG. 16.
Figure 18:
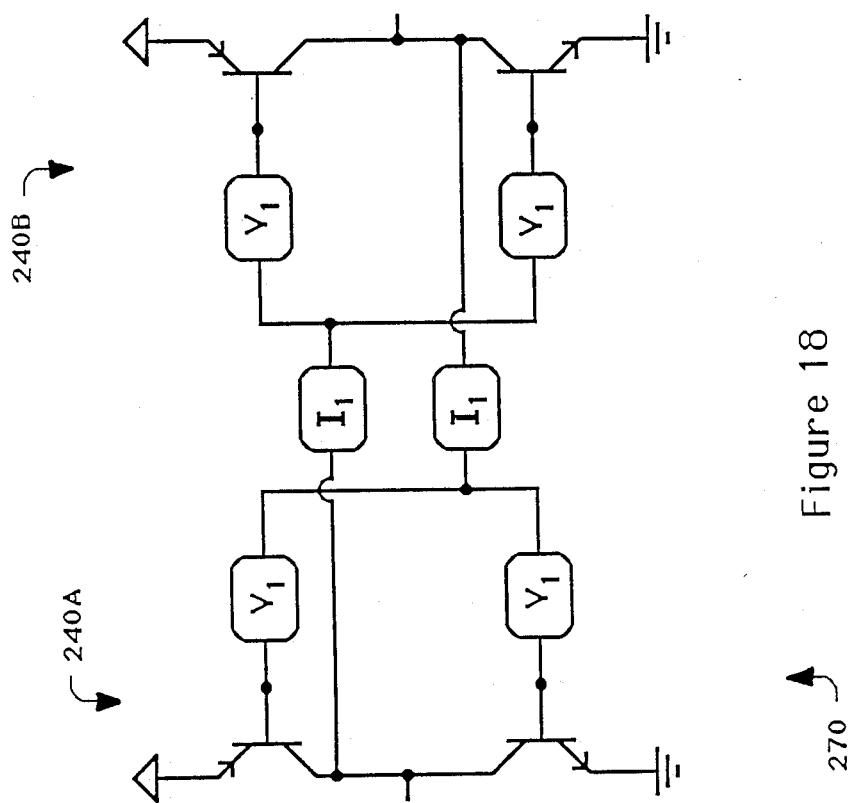
FIG. 18 is an electrical schematic diagram of a static memory cell employing two cross-coupled CNIL inverters of the type shown in FIG. 16.
Figure 19:
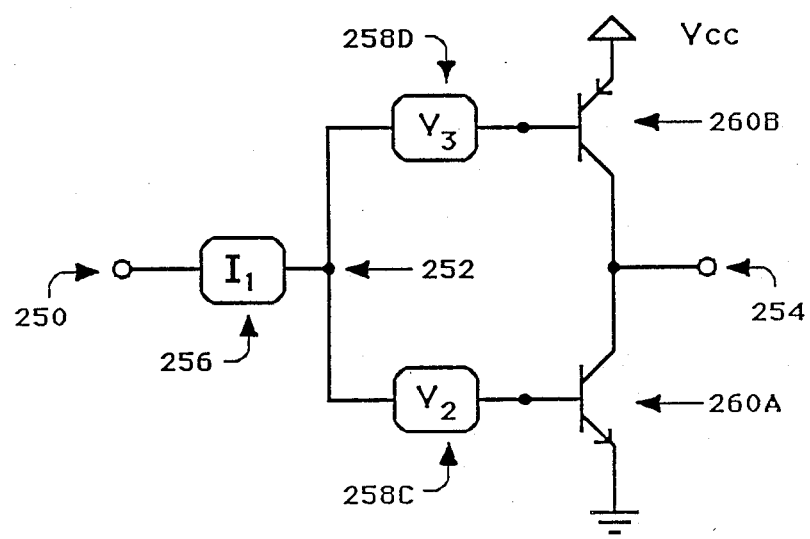
FIG. 19 is a CNIL inverter gate of the type shown in FIG. 16 which is used to interface different input and output voltage logic levels.
Figure 19:

The simplification of CNIL inverter 240 shown in FIG. 16 can be readily extended to more complex circuits. FIG. 18 is a schematic diagram of a static memory cell 270 employing two cross-coupled five-element inverters 240A and 240B of the type shown in FIG. 16. This reduced-element CNIL concept may also be extended to the dissimilar supply voltage logic interface discussed in connection with FIGS. 14 and 15. A schematic circuit of this interface circuit 280 is shown in FIG. 19. Like the circuits of FIGS. 14 and 15, interface circuit 280 of FIG. 19 is designed with different turn-on voltages of the constant-voltage elements 258C and 258D.

The CNIL logic circuitry of the present invention is a useful new combination of electronic circuit elements configured in a complementary circuit to yield a new family of digital logic gates and static memory cells. A simple inverter gate (FIG. 1) and a simple static memory cell (FIG. 13) are used here to present the CNIL concepts, however, it is understood that these concepts may readily be extended to more complex circuits that are also claimed as part of this invention. Examples of more complex circuits include multi-input NAND and NOR gates (and the like) which may be combined to implement full scale logic systems such as gate arrays and custom VLSI systems. More complex gates may be designed similar to CMOS gates. The invention features large noise margins and large logic swings —properties that are very desirable and previously difficult to obtain. The preferred embodiments of the present invention feature complementary drivers which yield high-speed, symmetric logic transitions. In addition, another primary advantage of the present invention is that it consumes only a small amount of standby power that does not depend on the logic state of the gate or cell.

Figure 20:
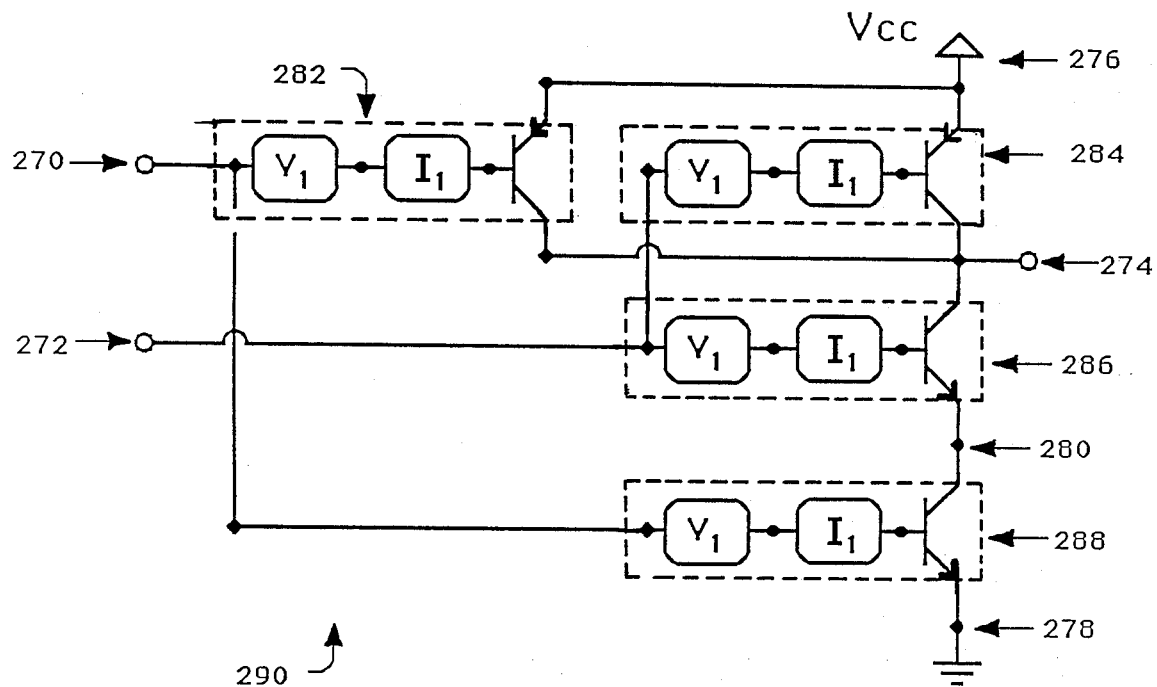
FIG. 20 is a schematic diagram of a CNIL two input NAND gate.

Claimed as part of the present CNIL invention is the embodiment of an entire CNIL logic family—NAND, NOR, XOR, Adders, MUXes, ALUs, gate arrays, full custom logic and any other analogous entities. These gates and logic functions can be implemented with (but are not limited to) designs similar to CMOS designs. As an example, FIG. 20 shows the schematic diagram of a CNIL two-input NAND gate. This gate has two inputs 270 and 272, one output 274, one power-supply connection 276, and a ground node 278. Conceptually the gate can be thought of as having four "NIL Transistors"; two "P-type NIL Transistors" 282 and 284, and two "N-Type NIL Transistors" 286 and 288. In this example, a P-Type NIL Transistor consists of a PNP driver with a series pair, in either sequence, of a constant-voltage element and a constant-current element (like 34 of FIG. 8) connected between the PNP base node and the NIL Transistor input node. Similarly, the N-Type NIL Transistor is configured with a constant-voltage and constant-current pair connected in series between its input node and its "internal" NPN base node. In the example NAND gate 290 in FIG. 20, both emitters of the P-Type NIL Transistors are connected to the power node 276 and both collectors are connected to the output node 274, the input of 282 is connected to one gate input node 270, and the input of 284 is connected to the other gate input node 272. The N-Types are configured in series such that 286 has its collector connected to output node 274, its emitter connected to the collector of 288 at node 280 and the emitter of 288 completes the return path to ground by connecting its emitter to ground node 278. The input of 286 is connected to the gate input node 272 and the input of 288 is connected to the other gate input node 270. What is claimed here is the rights to an entire CNIL logic family which may (but not necessarily) follow a design architecture similar to that of CMOS; we are not claiming the CMOS design, but rather are employing its configuration using NIL Transistors.

Figure 21:
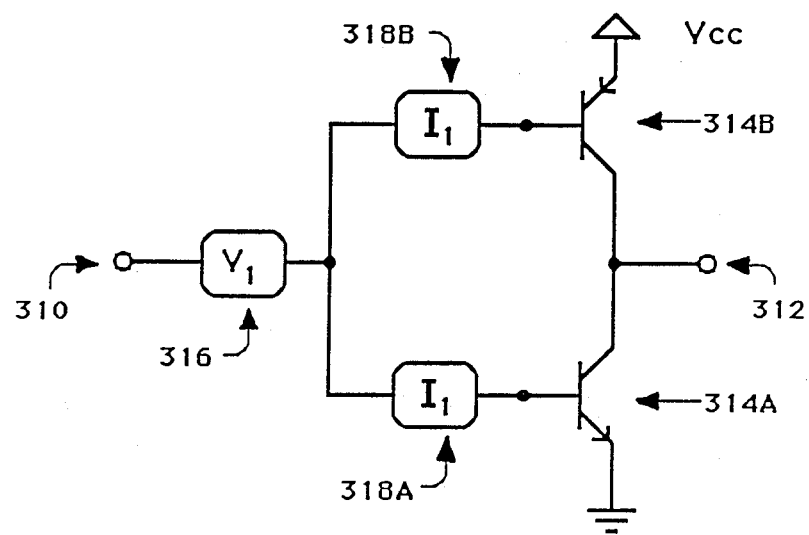
FIG. 21 is a schematic diagram of a five-element CNIL inverter gate.

FIG. 21 shows still another embodiment of a five-element inverter 300, which includes an input node 310, output node 312, drivers 314A and 314B, bilateral constant-voltage element 316, and constant-current elements 318A and 318B.

A number of different embodiments are available using the CNIL circuitry and therefore are part of this invention. Other embodiments include, but are not limited to the following: various types of driver devices may be employed; JFETs, MESFETs, IGFETs, Darlington-connected devices, Schottky-clamped BJTs and the like. Fabrication technologies include, but are not limited to. silicon, GaAs, and Bi-CMOS. Various means can be used as the constant-voltage elements; these include but are not limited to, a punch-through device, a forward diode, two or more forward diodes in series, one or more Zener diodes, or one or more avalanche-breakdown diodes, circuits configured of several components, and even resistors at the loss of some performance. Various means can be used to act as the constant-current elements; these include, but are not limited to, one or more D-mode FETs with gate floating, one or more D-mode FETs with gate connected to source, one or more E-mode FETs with gate appropriately biased, other devices such as MOSFETs, MESFETs, and JFETs; many device structures employing the velocity-saturation phenomenon, circuits configured of several components (circuits such as, but not limited to, current mirrors), and even resistors at the loss of some performance. CNIL circuits can be implemented in bipolar-CMOS technology too (e.g. use a D-mode MOSFET for a constant-current element). The constant-voltage and constant-current elements can have their order interchanged and achieve similar results. Likewise, as discussed in the previously-mentioned copending application, bleeder resistors may be connected between various nodes of the CNIL circuit to drain off excess leakage currents that might cause the drivers to turn ON prematurely. It has also been found to be advantageous in some embodiments to provide speed-up diodes to enhance turn-off times (e.g. discharge internal nodes).

The present invention provides a close approach to the ideal logic element. In general, there are ten characteristics that describe the *ideal* digital logic element.

(1) Operation from a single power supply source ($V_{CC}$). [Yes.]

(2) Large symmetric logic swing—ideally from 0 to $V_{CC}$ volts. [Close; ninety-two percent of $V_{CC}$ in this example where $V_{CC}$ is 5V.]

(3) Large noise margins at the input—ideally equal to fifty precent of the logic swing. [Close; forty-three percent of the logic swing in this example where $V_{CC}$ is 5V. Note that both the logic swing and the noise margin percentages will increase when larger values of $V_{CC}$ are employed.]

(4) Abrupt transition in the output signal when the input passes $V_{CC}/2$. [Yes.]

(5) Minimal propoagation delay. [Yes.]The CNIL circuits can use the proven high speed performance of the BJT.]

(6) High input impedance. [Yes.]

(7) Low output impedance. [Yes.]

(8) Minimal power consumption during steady state which does not depend upon the logic state. [Yes.]

(9) Simplicity in design. [Yes.]

(10) A reasonably uncomplicated and cost-effective fabrication process. [Yes.]

The present invention has a great deal of inherent design flexibility. CNIL, like NIL, features independent control over the voltage and current levels existing within the gates. This sort of design flexibility is very desirable and is not as readily attainable in other logic families.

The previous NIL invention is very useful in its own right and can outperform the popular logic families of today. However, the present invention (CNIL) remedies several shortcomings that NIL has. CNIL yields logic elements with more symmetric operation because of their complementary configuration, resulting in faster and nearly equal low-to-high and high-to-low transitions at the outputs of these gates. In the Present invention the output node is pulled up only when the pull-up driver transistor is turned ON and the pull-down driver is OFF. On the other hand, in the NIL designs, an uncontrolled load is always trying to pull up the output node—drawing a significant amount of power from the supply when the single driver transistor is trying to hold its output node low. When "strong"-'loads are used to effect rapid low-to-high transitions at the output, this will cause a substantial amount of standby power consumption in the NIL case. This feature will tend to degrade the overall performance of the NIL gates. CNIL features a more convenient and efficient trade-off betwen power and speed.

Although the present invention has been described with reference to preferred embodiments, workers skilled in the art will recognize that changes may be made in form and detail without departing from the spirit and scope of the invention.

What is claimed is:

1. A circuit for providing an output signal as a function of an input signal, the output signal switching between first and second logic states when the input signal reaches a logic-transition voltage range; the circuit comprises:

first and second supply-voltage nodes;

an input node at which the input signal is received;

an output node at which the output signal is supplied;

first driver means having a main current path connected between the first supply-voltage node and the output node, and having a control electrode connected through a first electrical path to the input node;

second driver means having a main current path connected between the second supply-voltage node and the output node, and having a control electrode connected through a second electrical path to the input node;

means connected to the first and second electrical paths for permitting voltage drops between the input node and the control electrodes of the first and second driver means approximately independent of current; and means connected to the first and second electrical paths for regulating current through the control electrodes of the first and second driver means approximately independent of voltage;

wherein the means for regulating and the means for permitting voltage drops interact to provide first and second noise margins which are larger than the logic-transition voltage range.

2. The circuit of claim 1 wherein the means for permitting voltage drops comprises:

first means connected in the first electrical path between the input node and the control electrode of the first driver means for permitting a first voltage drop; and second means connected in the second electrical path between the input node and the control electrode of the second driver means for permitting a second voltage drop.

3. The circuit of claim 1 wherein the means for regulating current is connected to the first and second electrical paths between the input node and the first and second driver means, respectively.

4. The circuit of claim 3 wherein the means for regulating current includes a bilateral constant-current element.

5. The circuit of claim 1 wherein the means for regulating current comprises:
   first means connected to the first electrical path for regulating current in the first electrical path; and
   second means connected to the second electrical path for regulating current in the second electrical path.

6. The circuit of claim 5 wherein the means for permitting voltage drops includes a bilateral constant voltage element connected between the input node and the first and second means.

7. The circuit of claim 2 wherein the first and second voltage drops are not equal.

8. The circuit of claim 1 wherein the driver means comprises an enhancement-mode transistor.

9. The circuit of claim 1 wherein the means for permitting voltage drops comprises a punch-through level shifter.

10. The circuit of claim 1 wherein the means for regulating current includes a depletion-mode transistor.

11. The circuit of claim 1 wherein the means for regulating current includes a FET operating in a saturation regime.

12. The circuit of claim 11 wherein the FET is a depletion mode FET.

13. The circuit of claim 11 wherein a gate and source of the FET are connected together.

14. A memory circuit which includes a pair of logic elements cross-coupled so that an input node of each logic element is connected to an output node of the other logic element and which exhibits an output state at the output node which changes when an input voltage at the input node reaches a logic-transition voltage range defined by first and second logic-transition voltage levels, each logic element including:
   first and second supply-voltage nodes;
   first driver means having a main current path connected between the first supply voltage node and the output node, and having a control electrode;
   second driver means having a main current path connected between the second supply voltage node and the output node, and having a control electrode;
   means for permitting voltage drops between the input node and the control electrodes of the first and second driver means approximately independent of current to permit the input voltage to vary in a first noise margin region between a first voltage extreme and the first logic-transition voltage level without causing the output state at the output node to change from a first state to a second state; the first noise margin region being greater than the logic-transition voltage range; and
   means for regulating current through the control electrodes of the first and second driver means approximately independent of voltage and for permitting the input voltage to vary in a second noise margin region between a second voltage extreme and the second logic-transition voltage level without causing the output state at the output node to change from the second state to the first state; the second noise margin region being greater than the logic-transition voltage range.

15. The memory circuit of claim 14 wherein the means for permitting voltage drops comprises:
   first means connected in a first series path between the input node and the control electrode of the first driver means for permitting a first voltage drop; and
   second means connected in a second series path between the input node and the control electrode of the second driver means for permitting a second voltage drop.

16. The memory circuit of claim 15 wherein the means for regulating current is connected in the first and second series paths between the input node and the first and second means, respectively.

17. The memory circuit of claim 15 wherein the means for regulating current comprises:
   first means connected in the first series path for regulating current in the first series path; and
   second means connected in the second series path for regulating current in the second series path.

18. The memory circuit of claim 17 wherein the means for permitting voltage drops includes a bilateral constant-voltage element connected between the input node and the first and second means.

19. A circuit comprising:
   an input node for receiving an input signal;
   an output node for supplying an output signal having first and second logic states;
   a pull-up driver connected to the output node and having a control electrode, the pull-up driver having first and second conduction states as a function of a first control signal at its control electrode;
   a pull-down driver connected to the output node and having a control electrode, the pull-down driver having first and second conduction states as a function of a second control signal at its control electrode; the output signal having a first logic state when the pull-up driver is in its first conduction state and the pull-down driver is in its second conduction state; and the output signal having the second logic state when the pull-up driver is in its second conduction state and the pull-down driver is in its first conduction state;
   a first circuit connected to input node and the control electrode of the pull-up driver which includes means for regulating current through the control electrode of the pull-up driver when the pull-up driver is in one of its conduction states, and means for establishing a first voltage drop which determines a first logic-transition voltage level at which the pull-up driver changes conductive state;
   a second circuit connected to the input node and the control electrode of the pull-down driver which includes means for regulating current through the control electrode of the pull-down driver when the pull-down driver is in one of its conductive states, and means for establishing a second voltage drop which determines a second logic-transition voltage level of the input signal at which the pull-down driver changes conduction state;
   wherein the first and second circuits define noise margins which are greater than a logic-transition voltage range defined by the first and second logic-transition voltage levels.

20. The circuit of claim 19 wherein the means for regulating current of the first circuit and the means for regulating current of the second circuit are a bilateral constant-current element connected to the input node.

21. The circuit of claim 19 wherein the first and second voltage drops are not equal.

22. The circuit of claim 19 wherein the pull-up and pull-down drivers comprise enhancement-mode transistors.

23. The circuit of claim 22 wherein the enhancement-mode transistors are bipolar junction transistors.

24. The circuit of claim 19 wherein the means for establishing the first and second voltage drops comprise punch-through level shifters.

25. A memory circuit which includes a pair of logic elements cross-coupled so that an input node of each logic element is connected to an output node of the other logic element, each logic element including:
   a pull-up driver connected to the output node and having a control electrode;
   a pull-down driver connected to the output node and having a control electrode;
   a first circuit connected between the input node and the control electrode of the pull-up driver which includes means for regulating current through the control electrode of the pull-up driver while permitting voltage at the input node to vary between a first voltage extreme and a first logic-transition voltage level without causing the pull-up driver to turn off, and means for establishing a first voltage drop which permits the voltage at the input node to vary between a second voltage extreme and a second logic-transition voltage level without causing the pull-up driver to turn on;
   a second circuit connected between the input node and the control electrode of the pull-down driver which includes means for regulating current through the control electrode of the pull-down driver while permitting the voltage at the input node to vary between the second voltage extreme and the second logic-transition voltage level without causing the pull-down driver to turn off, and means for establishing a second voltage drop which permits the voltage of the input node to vary between the first voltage extreme and the first logic transition voltage level without causing the pull-down driver to turn on;
   wherein a first noise margin region defined by the first voltage extreme and the first logic-transition voltage level is greater than a logic-transition voltage range defined by the first and second logic-transition voltage levels; and
   wherein a second noise margin region defined by the second voltage extreme and the second logic-transition voltage level is larger than the logic-transition voltage range.

26. The memory circuit of claim 25 wherein in each logic element the means for regulating current of the first circuit and the means for regulating current of the second series circuit are a bilateral constant-current element connected to the input node.

27. The memory circuit of claim 26 wherein the means for establishing a first voltage drop and the means for establishing a second voltage drop are a bilateral constant-voltage element connected to the input node.

28. A logic circuit of the type which has complementary drivers, which exhibits first and second output states which are a function of an input voltage which varies between first and second input voltage extremes, and which changes output state when the input voltage reaches a logic-transition voltage range defined by first and second logic-transition voltage levels, characterized in that each of the drivers has a control electrode which is connected to a circuit which includes:
   means for regulating current through the control electrode while permitting the input voltage to vary in a second noise margin region between the second voltage extreme and the second logic-transition voltage level without causing a change of output state; and
   means for establishing a voltage drop that defines the logic-transition voltage range while permitting the input voltage to vary in a first noise margin region between the first voltage extreme and the first logic-transition voltage level without causing a change of output state;
   wherein the first and second noise margin regions are larger than the logic-transition voltage range.

29. A circuit comprising:
   a first input node;
   an output node;
   a first driver connected to the output node and having a control electrode;
   a second driver connected to the output node and having a control electrode the first and second drivers being of complementary type and defining a first output state in which the first driver is on and the second driver is off and a second output state in which the first driver is off and the second driver is on;
   a first circuit connected between the first input node and the control electrode of the first driver which includes means for regulating current through the control electrode of the first driver while permitting voltage at the first input node to vary between a first voltage extreme and a first logic-transition voltage level without causing the first driver to turn off, and means for establishing a voltage drop which permits the voltage at the first input node to vary between a second voltage extreme and a second logic-transition voltage level without causing the first driver to turn on; and
   a second circuit connected between the first input node and the control electrode of the second driver which includes means for regulating current through the control electrode of the second driver while permitting the voltage at the first input node to vary between the second voltage extreme and the second logic-transition voltage level without causing the second driver to turn off, and means for establishing a voltage drop which permits the voltage at the first input node to vary between the first voltage extreme and the first logic transition voltage level without causing the second driver to turn on;
   wherein a first noise margin region defined by the first voltage extreme and the first logic-transition voltage level is greater than a logic-transition voltage range defined by the first and second logic-transition voltage levels; and
   wherein a second noise margin region defined by the second voltage extreme and the second logic-transition voltage level is greater than the logic-transition voltage range.

30. The circuit of claim 29 and further comprising:
   a second input node;

a third driver connected to the output node and having a control electrode;

a third circuit connected between the second input node and the control electrode of the third driver which includes means for regulating current through the control electrode of the third driver, and means for establishing a voltage drop which permits voltage at the second input node to vary between one of the voltage extremes and the logic-transition voltage range without causing the third driver to change conductive state.

31. A digital circuit which exhibits first and second logic states at an output node as a function of an input signal received at an input node, the digital circuit exhibiting the first logic state when the input signal is below a first logic-transition voltage level and exhibits the second logic state when the input signal is above a second logic-transition voltage level; the digital circuit comprising:

first driver means connected to the output node and having a control electrode for receiving a first control signal, the first driver means being turned on when the digital circuit is in its first logic state and being turned off when the digital circuit is in its second logic state;

second driver means connected to the output node and having a control electrode for receiving a second control signal, the second driver means being turned off when the digital circuit is in its first logic state and turned on when the digital circuit is in its second logic state;

first control-signal-generating means connected to the input node and the control electrode of the first driver means for producing the first control signal as a function of the input signal;

second control-signal-generating means connected to the input node and the control electrode of the second driver means for producing the second control signal as a function of the input signal;

wherein each of the first and second control-signal-generating means include:

first means for switching from a nonconductive state to a conductive state when the input signal reaches one of the logic-transition voltage levels at the input node; the first means permitting the input signal at the input node to be changed in a noise margin region from one of the first and second input voltage extremes to one of the first and second logic transition voltage levels without causing the digital circuit to change logic state; and the first means, when in its conductive state, causing the digital circuit to change logic state; and second means for regulating current through itself that is approximately independent of voltage across itself the second means thereby permitting the input signal to vary in a noise margin region from one of the logic transition voltage levels to one of the input-voltage extremes while the digital circuit remains in the second logic state;

wherein a first noise margin region defined by the first voltage extreme and the first logic-transition voltage level is greater than a logic-transition voltage range defined by the first and second logic-transition voltage levels; and wherein a second noise margin region defined by the second voltage extreme and the second logic-transition voltage level is greater than the logic-transition voltage range.

32. A digital circuit for providing an output signal which exhibits first and second logic states depending on magnitude of an input signal voltage with respect to a logic-transition voltage range, the digital circuit comprising:

first and second supply-voltage nodes;

an input node at which the input signal is received;

an output node at which the output signal is supplied;

first driver means, having a first main-current path which includes first and second main current-carrying electrodes connected between the first supply voltage node and the output node, and having a control electrode through which a first control current can flow, for causing a switching transition of the first main-current path from a first conduction state to a second conduction state, and for which there exists an inherent turn-on voltage range that is an amount of change in voltage at the control electrode that occurs when the first driver means is switched between its first and second conduction states;

second driver means, having a second main-current path which includes first and second main current-carrying electrodes connected between the second supply-voltage node and the output node, and having a control electrode through which a second control current can flow, for causing a switching transition of the second main current path from a first conduction state to a second conduction state, and for which there exists an inherent turn-on voltage range that is an amount of change in voltage at the control electrode that occurs when the second driver means is switched between its first and second conduction states;

wherein the logic-transition voltage range at the input node has a magnitude, with respect to one of the first and second supply voltage nodes, which exceeds the magnitude of the turn-on voltage range for either of the first and second driver means;

wherein the logic state of the output signal is determined by whether the voltage at the input node is above or below the logic-transition voltage range and each logic state is characterized by one of the first and second control currents flowing through the respective first and second control electrodes, with the first logic state being one in which the first main current path of the first driver means is switched on and the second main current path of the second driver means is switched off, and the second logic state being one in which the second main current path of the second driver means is switched on and the first main current path of the first driver is switched off;

circuit means connected to first and second electrical paths from the input node to the first and second control electrodes, respectively, the circuit means including:

first means for permitting a first variable voltage drop across itself without conducting substantial current through itself, thereby permitting the input signal voltage at the input node to be changed from a first input voltage extreme to the logic-transition voltage range without changing the first logic state, which yields a first noise margin for the digital circuit pertaining to the first logic state, wherein the logic-transition voltage range at the input node is determined by a specific voltage value from terminal to terminal of the first means and when voltage from terminal to terminal is increased slightly beyond the specific voltage value then substantial current flows through the first means and the digital circuit begins to change from the first logic state to the second logic state; and second means for regulating current through itself, approximately independent of voltage, thereby regulating the current through the control electrode of one of the driver means pertaining to the second logic state, wherein the second means serves as a voltage sponge, thus permitting a second variable voltage drop that is larger in magnitude than the inherent turn-on voltage ranges, thereby permitting the input voltage signal at the input node to vary beyond the logic-transition voltage range to a second input voltage extreme while the digital circuit remains in the second logic state, thereby yielding a second noise margin for the digital circuit pertaining to the second logic state;

wherein the first and second noise margins are greater than the logic-transition voltage range.

33. The digital circuit of claim 32 wherein the first input voltage extreme is approximately equal to a voltage at one of the supply-voltage nodes, and wherein the second input-voltage extreme is approximately equal to a voltage at the other supply-voltage node.

34. A digital circuit for providing an output signal which exhibits first and second logic states at an output node depending on magnitude of an input voltage at an input node with respect to a logic-transition voltage range, the digital circuit comprising:

first and second driver means connected to the output node for determining which of the first and second logic states will appear at the output node as a function of first and second control signals received at the control electrodes of the first and second driver means, respectively, the first logic state being exhibited when the first driver means is on and the second driver means is off, and the second logic state being exhibited when the first driver means is off and the second driver means is on; and circuit means connected to the input node and the control electrodes of the first and second driver means for supplying the first and second control signals as a function of the input voltage to control turn-on and turn-off of the first and second driver means, the circuit means including:

first means for permitting the input voltage to change in a first noise margin region from a first voltage extreme to the logic-transition voltage range without a change in the logic state at the output node and for switching from a nonconductive to a conductive state when the input voltage reaches the logic-transition voltage that is defined by the first means switching to a conductive state; and second means for regulating current through one of the control electrodes when the first means is in a conductive state, while permitting voltage at the input node to vary in a second noise margin region from the logic-transition voltage range to a second voltage extreme without causing a change in the second logic state at the output node;

wherein the first and second noise margin regions are greater than the logic-transition voltage range.

35. A digital circuit for providing an output signal which exhibits first and second logic states at an output node depending on magnitude of an input voltage at an input node with respect to a logic transition voltage range, the digital circuit comprising:

first and second driver means connected to the output node for determining which of the first and second logic states will appear at the output node as a function of first and second control signals received at the control electrodes of the first and second driver means, respectively, the first logic state being exhibited when the first driver means is one and the second driver means is off, and the second logic state being exhibited when the first driver means is off and the second driver means is on; and a first circuit between the input node and the first control electrode for providing a first control signal as a function of the input signal;

a second circuit between the input node and the second control electrode for providing a second control signal as a function of the input signal;

wherein the first and second circuits each include:

first means for switching from a nonconductive to a conductive state when the input signal reaches the logic transition voltage range; and second means connected in series with the first means for regulating current through one of the first and second control electrodes when the first means is in a conductive state, while providing a variable voltage drop to accomodate input signal voltage outside of the logic-transition voltage range; the first and second means interacting to provide noise margins which are greater than the logic-transition voltage range.

36. In a digital circuit which includes:
first and second supply-voltage nodes;
an input node;
an output node;
a first driver having a main-current path connected between the first supply-voltage node and the output node, and having a first control electrode;
a second drive having a main-current path connected between the second supply-voltage node and the output node, and having a second control electrode;
and in which the digital circuit has a first logic state in which the first driver is ON and the second driver is OFF; and a second logic state in which the first driver is OFF and the second driver is ON; an improvement comprising:

circuit means that comprises electrical paths between the input node and the control electrodes, and at least one series combination of circuit elements comprising constant-voltage means and a constant-current means that is connected to the electrical paths, wherein the circuit means, including the series combination, for controlling circuit means current through the first and second control electrodes, permitting input voltage at the input node to be varied from a first input-voltage extreme to a first boundary of a logic-transition voltage range without causing a transition from the first to the second logic state of the digital circuit, which thereby yields a noise margin that is larger than the logic-transition voltage range, and permitting the input voltage to be varied from a second boundary of the logic-transition voltage range to a second input-voltage extreme without causing a transition from the second to the first logic state, thereby defining a second noise margin that is larger than the logic-transition voltage range.

37. The improvement of claim 36 wherein:

the constant-voltage means permits a first variable-voltage drop across itself without conducting a substantial current until the first variable-voltage drop reaches a specific turn-on voltage, at which point the constant-voltage element begins to conduct; and the constant-current means absorbs a second variable-voltage drop across two of its terminals while independently maintaining a substantially constant current through itself.

* * * * *

UNITED STATES PATENT AND TRADEMARK OFFICE
CERTIFICATE OF CORRECTION

PATENT NO. : 4,868,904
DATED : September 19, 1989
INVENTOR(S) : Roger J. Gravrok et al.

It is certified that error appears in the above-identified patent and that said Letters Patent is hereby corrected as shown below:

Column 12, line 46, after "connected to" insert --the--.

Column 14, delete lines 25-31, and insert:

--a second driver connected to the output node and having a control electrode;

the first and second drivers being of complementary type and defining a first output state in which the first driver is on and the second driver is off and a second output state in which the first driver is off and the second driver is on;--

Column 18, line 47, delete "drive" and insert --driver--.

Signed and Sealed this

Eighth Day of January, 1991

Attest:

HARRY F. MANBECK, JR.

*Attesting Officer*  *Commissioner of Patents and Trademarks*